(12) United States Patent
Nagase et al.

(10) Patent No.: US 9,312,475 B2
(45) Date of Patent: Apr. 12, 2016

(54) MAGNETORESISTIVE ELEMENT, MAGNETIC MEMORY, AND METHOD OF MANUFACTURING MAGNETORESISTIVE ELEMENT

(71) Applicant: Kabushiki Kaisha Toshiba, Minato-ku, Tokyo (JP)

(72) Inventors: Toshihiko Nagase, Yokohama (JP); Daisuke Watanabe, Yokohama (JP); Koji Ueda, Kamakura (JP); Katsuya Nishiyama, Yokohama (JP); Eiji Kitagawa, Yokohama (JP); Kenji Noma, Yokohama (JP); Tadashi Kai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 14/147,072

(22) Filed: Jan. 3, 2014

(65) Prior Publication Data
US 2014/0119109 A1 May 1, 2014

Related U.S. Application Data

(63) Continuation of application No. PCT/JP2012/058277, filed on Mar. 19, 2012.

(30) Foreign Application Priority Data

Jul. 4, 2011 (JP) ................................. 2011-148446

(51) Int. Cl.
*H01L 43/08* (2006.01)
*H01L 43/12* (2006.01)
(Continued)

(52) U.S. Cl.
CPC .............. *H01L 43/08* (2013.01); *G11C 11/161* (2013.01); *G11C 11/1675* (2013.01); *H01L 43/12* (2013.01); *H01L 27/228* (2013.01)

(58) Field of Classification Search
None
See application file for complete search history.

(56) References Cited

U.S. PATENT DOCUMENTS 5,315,282 A * 5/1994 Shinjo et al. ................. 338/32 R
7,468,542 B2   12/2008 Hayakawa et al.
(Continued)

FOREIGN PATENT DOCUMENTS

JP    2004-179187    6/2004
JP    2007-059879    3/2007
(Continued)

OTHER PUBLICATIONS

S. Ikeda et al, "A Perpendicular-Anisotropy CoFeB—MgO Magnetic Tunnel Junction", Nature Materials 2804 pp. 1-4, Jul. 11, 2010.
(Continued)

*Primary Examiner* — James G Norman
(74) *Attorney, Agent, or Firm* — Knobbe, Martens, Olson & Bear, LLP

(57) ABSTRACT

According to one embodiment, a magnetoresistive element includes first and second magnetic layers, a first nonmagnetic layer, a conductive layer. The first and second magnetic layers have axes of easy magnetization perpendicular to a film plane. The first and second magnetic layers have variable and invariable magnetization directions, respectively. The first nonmagnetic layer is between the first and second magnetic layers. The conductive layer is on a surface of the first magnetic layer opposite to a surface on which the first nonmagnetic layer is formed. The first magnetic layer has a structure obtained by alternately laminating magnetic and nonmagnetic materials. The nonmagnetic material includes at least one of Ta, W, Nb, Mo, Zr, Hf. The magnetic material includes Co and Fe. One of the magnetic materials contacts the first nonmagnetic layer. One of the nonmagnetic materials contacts the conductive layer.

18 Claims, 13 Drawing Sheets

(51) Int. Cl.
*G11C 11/16* (2006.01)
*H01L 27/22* (2006.01)

(56) References Cited

U.S. PATENT DOCUMENTS

| | | | |
|---|---|---|---|
| 7,768,824 B2 | 8/2010 | Yoshikawa et al. | |
| 7,932,571 B2 | 4/2011 | Rizzo et al. | |
| 8,058,697 B2 | 11/2011 | Guo et al. | |
| 8,268,641 B2 | 9/2012 | Guo et al. | |
| 8,508,004 B2 | 8/2013 | Rizzo et al. | |
| 8,575,711 B2 | 11/2013 | Higo et al. | |
| 2001/0024380 A1* | 9/2001 | Goebel et al. | 365/158 |
| 2002/0055016 A1* | 5/2002 | Hiramoto et al. | 428/692 |
| 2006/0003185 A1* | 1/2006 | Parkin | 428/692.1 |
| 2007/0086121 A1 | 4/2007 | Nagase et al. | |
| 2008/0088980 A1 | 4/2008 | Kitagawa et al. | |
| 2008/0124582 A1 | 5/2008 | Kim et al. | |
| 2008/0164547 A1 | 7/2008 | Higo et al. | |
| 2008/0239589 A1 | 10/2008 | Guo et al. | |
| 2008/0247072 A1 | 10/2008 | Nozieres et al. | |
| 2009/0015958 A1 | 1/2009 | Nakamura et al. | |
| 2009/0080238 A1 | 3/2009 | Yoshikawa et al. | |
| 2009/0096042 A1 | 4/2009 | Rizzo et al. | |
| 2009/0224342 A1* | 9/2009 | Nakayama et al. | 257/421 |
| 2010/0118600 A1 | 5/2010 | Nagase et al. | |
| 2011/0062538 A1 | 3/2011 | Rizzo et al. | |
| 2012/0008381 A1 | 1/2012 | Nagase et al. | |
| 2012/0061784 A1 | 3/2012 | Nakamura et al. | |
| 2012/0064640 A1 | 3/2012 | Guo et al. | |
| 2012/0069642 A1 | 3/2012 | Ueda et al. | |
| 2012/0088125 A1 | 4/2012 | Nishiyama et al. | |
| 2012/0243305 A1 | 9/2012 | Nakayama et al. | |
| 2013/0244058 A1 | 9/2013 | Kim et al. | |
| 2014/0001587 A1 | 1/2014 | Higo et al. | |

FOREIGN PATENT DOCUMENTS

| | | | |
|---|---|---|---|
| JP | 2007-157840 | | 6/2007 |
| JP | 2008-098523 | | 4/2008 |
| JP | 2008-135676 | | 6/2008 |
| JP | 2008-244482 | | 10/2008 |
| JP | 2009-021352 | | 1/2009 |
| JP | 2009-081216 | | 4/2009 |
| JP | 2010-016408 | * | 1/2010 |
| JP | 2010-021580 | | 1/2010 |
| JP | 2010-522978 | | 7/2010 |
| JP | 2010-232499 | | 10/2010 |
| JP | 2011-501420 | | 1/2011 |
| JP | 2012-069595 | | 4/2012 |
| WO | WO 2009/049122 | | 4/2009 |
| WO | WO 2011/036795 | | 3/2011 |

OTHER PUBLICATIONS

International Search Report and Written Opinion dated Jan. 5, 2012 for International Application No. PCT/JP2012/058277, 23 pgs.
Office Action in Japanese Application No. 2011-148446 to which the present case claims priority mailed Nov. 19, 2013, 7pgs.

* cited by examiner

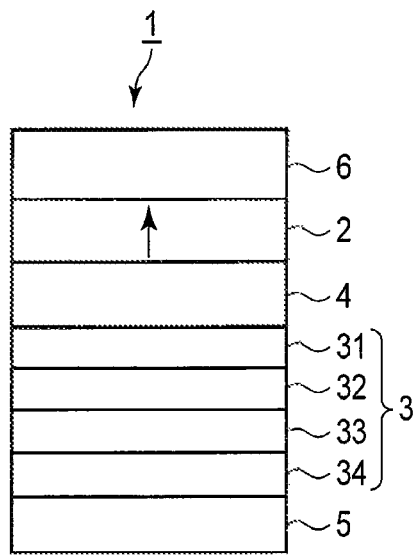
F I G. 1
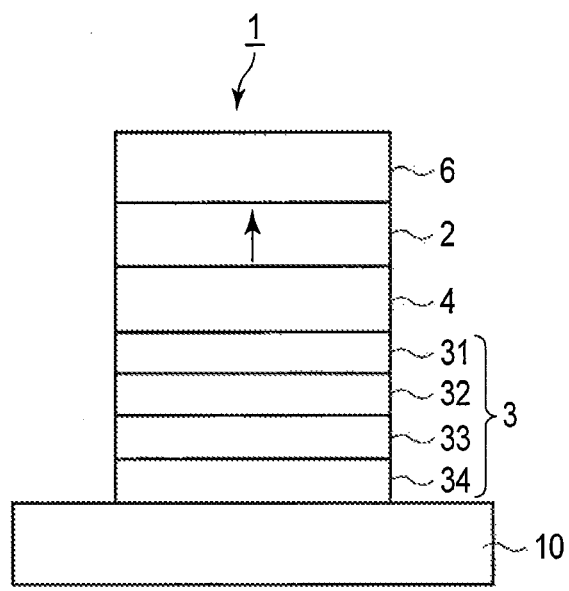
F I G. 2

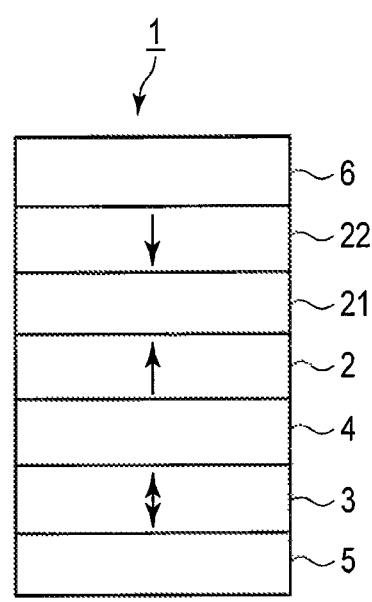
F I G. 5

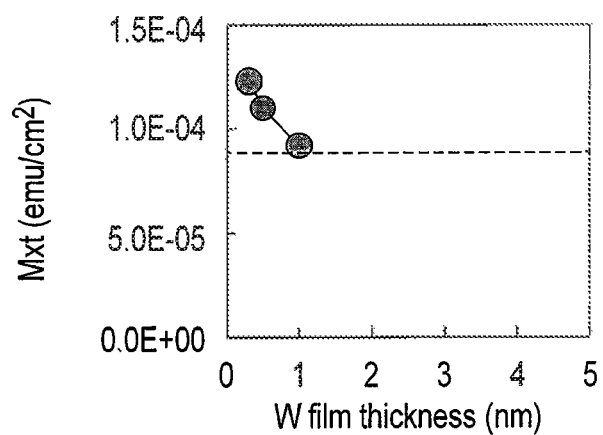
F I G. 7
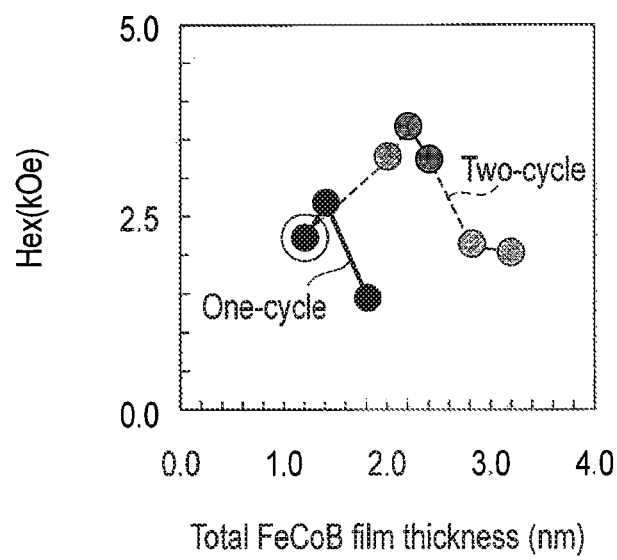
F I G. 8

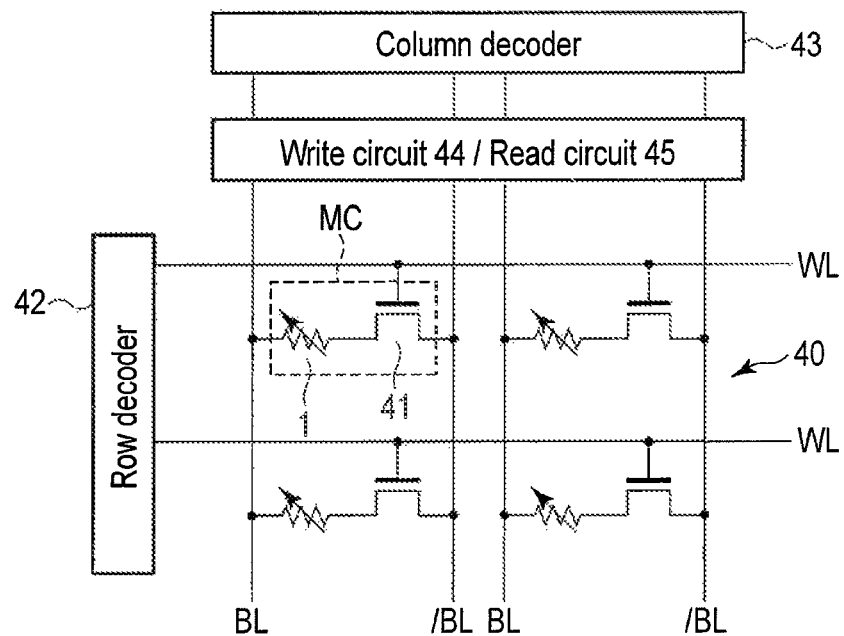
F I G. 9
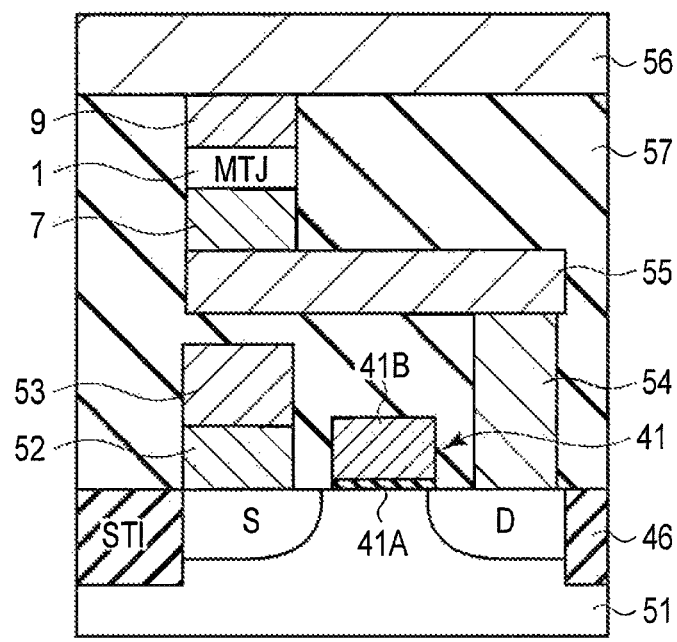
F I G. 10

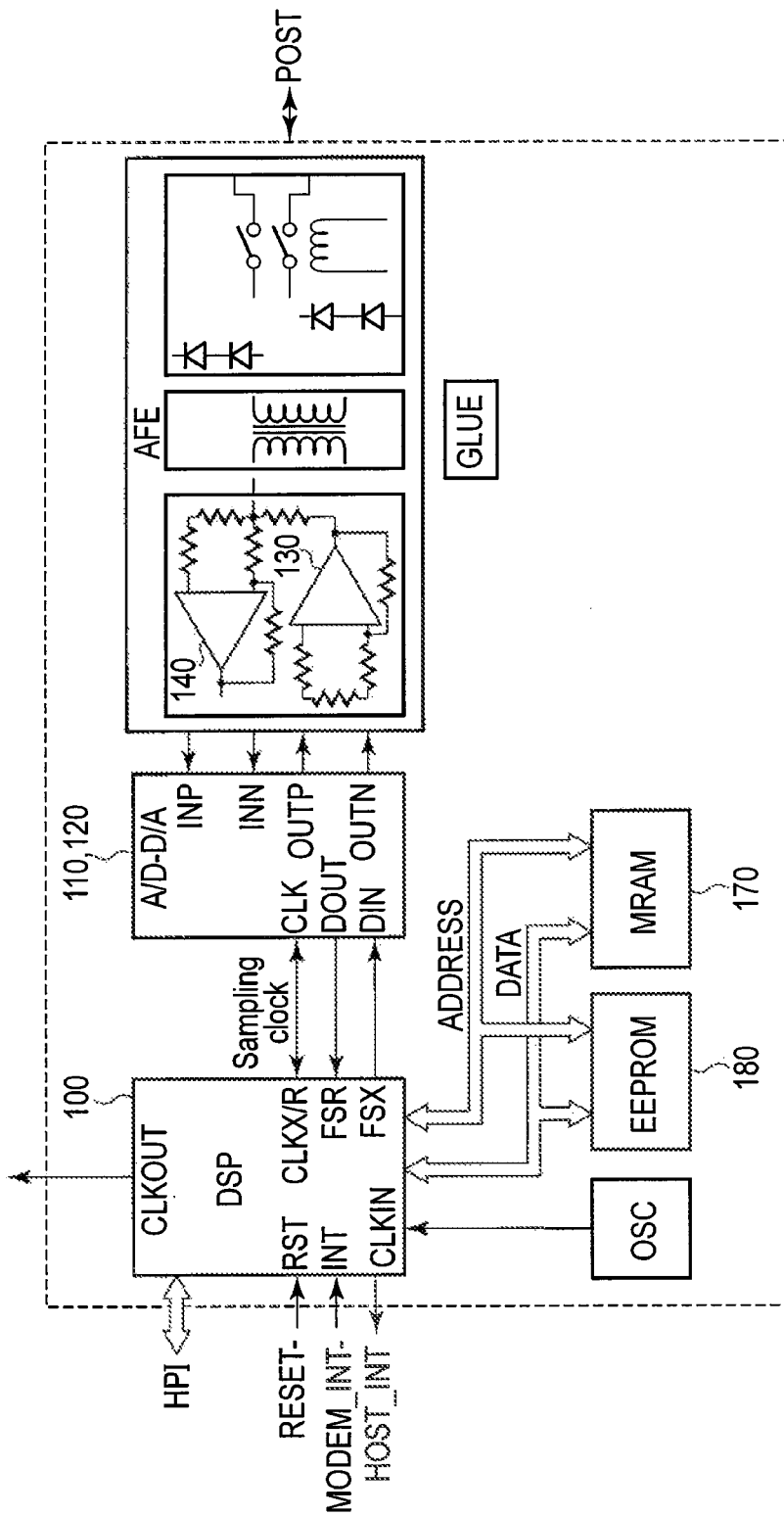
F I G. 11

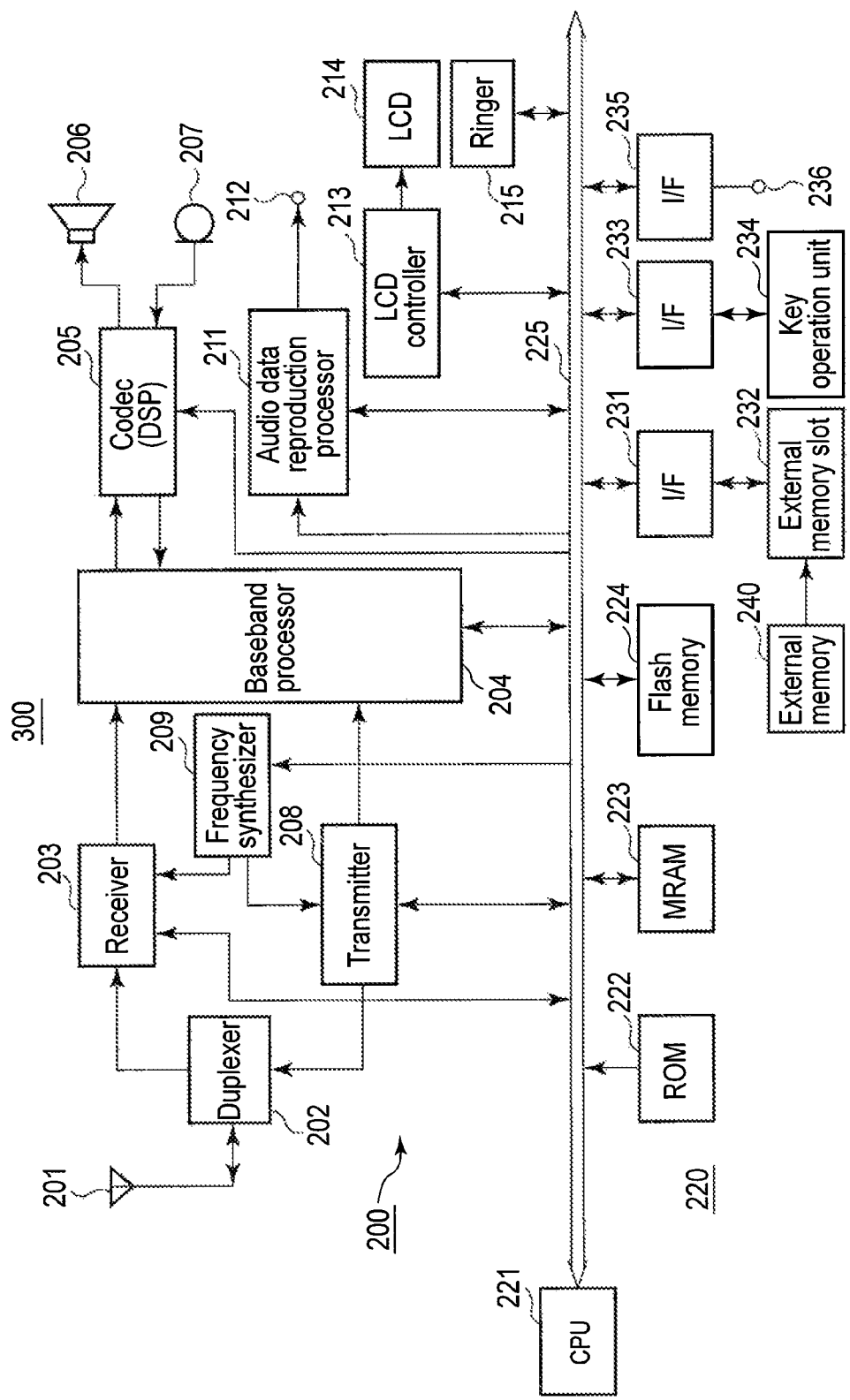
F I G. 12

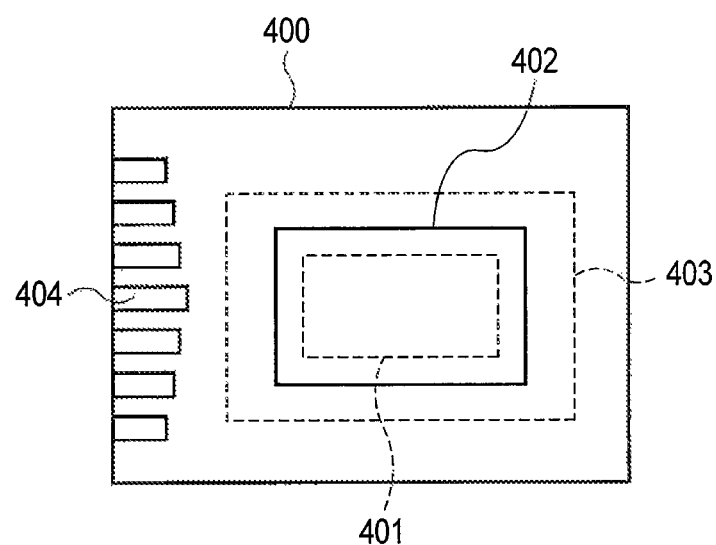
F I G. 13

MAGNETORESISTIVE ELEMENT, MAGNETIC MEMORY, AND METHOD OF MANUFACTURING MAGNETORESISTIVE ELEMENT

CROSS REFERENCE TO RELATED APPLICATIONS

This application is a Continuation application of PCT Application No. PCT/JP2012/058277, filed Mar. 19, 2012 and based upon and claiming the benefit of priority from Japanese Patent Application No. 2011-148446, filed Jul. 4, 2011, the entire contents of all of which are incorporated herein by reference.

FIELD

Embodiments described herein relate generally to a magnetoresistive element, a magnetic memory using the magnetoresistive element, and a method of manufacturing the magnetoresistive element.

BACKGROUND

A magnetoresistive element having a ferromagnetic tunnel junction is also called a magnetic tunnel junction (MTJ) element, and as its write system, a write (spin transfer torque write) system using spin momentum transfer (SMT) is proposed.

There has been assumed that a so-called perpendicular magnetization film having a magnetization easy axis in the film plane perpendicular direction is used as a ferromagnetic material making the magnetoresistive element. Since when magnetocrystalline anisotropy is used in a perpendicular magnetization structure, shape magnetic anisotropy is not used, an element size can be further reduced than in the in-plane magnetization structure. Further, since dispersion in the magnetization easy direction can be also reduced, a material having large perpendicular magnetocrystalline anisotropy is employed in order to realize both smaller element size and lower switching current while a thermal stability is maintained.

Material systems used for the perpendicular magnetization film include $L1_0$ ordered alloy system (such as FePt and CoPt), multilayer film (Co/Pt, Pd) system, hcp system (such as CoCrPt) and RE-TM system (such as Tb—CoFe).

Typically, a switching current for magnetization reversal by the spin transfer torque write system depends on saturation magnetization Ms and a magnetic relaxation constant $\alpha$ of a storage layer. Thus, it is important to reduce the saturation magnetization Ms and the magnetic relaxation constant $\alpha$ in order to switch the magnetization of the storage layer by low-current spin transfer torque.

Herein, the saturation magnetization. Ms can be reduced by adjustment of magnetic material's composition, addition of nonmagnetic element or the like. However, the reduction in the saturation magnetization Ms should not cause adverse effects on other properties.

BRIEF DESCRIPTION OF THE DRAWINGS

FIG. 1 is a cross-sectional view of a magnetoresistive element according to a first embodiment;

FIG. 2 is a cross-sectional view of a magnetoresistive element according to a first variant of the first embodiment;

FIG. 5 is a cross-sectional view of a magnetoresistive element according to a fourth variant of the first embodiment;

FIG. 7 is a diagram showing a magnetic property when W sandwiched by CoFeB is thicker according to the first embodiment;

FIG. 8 is a diagram showing magnetic properties of a one-cycle structure and a two-cycle structure in the storage layer according to the first embodiment;

FIG. 9 is a circuit diagram showing a structure of an MRAM according to a second embodiment;

FIG. 10 is a cross-sectional view of a memory cell in the MRAM according to the second embodiment;

FIG. 11 is a block diagram showing a DSL data path unit in a DSL modem as an application example;

FIG. 12 is a block diagram showing a cell phone terminal as an application example;

FIG. 13 is a top view of an MRAM card as an as an application example;

DETAILED DESCRIPTION

Figure 3:
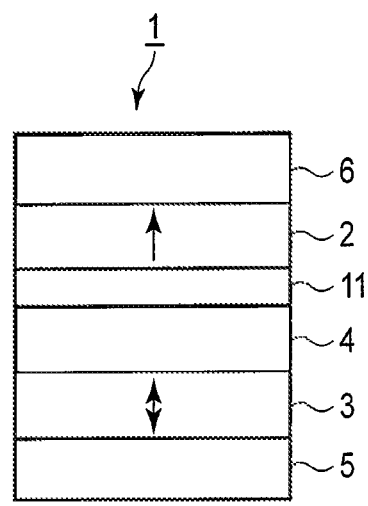
FIG. 3 is a cross-sectional view of a magnetoresistive element according to a second variant of the first embodiment.

In the following explanation, like reference numbers are denoted to like components having substantially the same function and structure, and a repeated explanation thereof will be omitted. Note that the drawings are schematic, and thus a relationship between thickness and plane dimension, a ratio of thickness in each layer, and the like are different from actual ones. Therefore, specific thicknesses or dimensions should be determined in consideration of the following explanation. Further, parts having a different mutual relationship or ratio between the drawings are contained, of course.

Each embodiment described later exemplifies a device or method for embodying the technical spirit of the present invention, and the technical spirit of the present invention does not intend to limit materials, shapes, structures, arrangements and the like of the components to the following ones. The technical spirit of the present invention may be variously modified in Claims.

In general, according to one embodiment, a magnetoresistive element includes a first magnetic layer, a second magnetic layer, a first nonmagnetic layer and a conductive layer. The first and second magnetic layers have an axis of easy magnetization perpendicular to a film plane. The first magnetic layer has a variable magnetization direction. The second magnetic layer has an invariable magnetization direction. The first nonmagnetic layer is provided between the first magnetic layer and the second magnetic layer. The conductive layer is formed on a surface of the first magnetic layer, which is opposite to a surface on which the first nonmagnetic layer is formed. The first magnetic layer has a structure obtained by alternately laminating a magnetic material and a nonmagnetic material. The nonmagnetic material includes at least one element from among Ta, W, Nb, Mo, Zr and Hf. The magnetic material includes Co and Fe. One of the magnetic materials contacts the first nonmagnetic layer, and one of the nonmagnetic materials contacts the conductive layer.

First Embodiment

A first embodiment relates to a magnetoresistive element.
(1) Structure of Magnetoresistive Element
FIG. 1 is a cross-sectional view of a magnetoresistive element according to the first embodiment.

In FIG. 1, the arrow indicates a magnetization direction. The magnetoresistive element in the specification and claims indicates a tunnel magnetoresistive (TMR) effect element in which a semiconductor or insulator is used for a spacer layer. Essential parts in the magnetoresistive element are shown in the following drawings, but additional layers, if containing the illustrated structure, may be contained.

A magnetoresistive element 1 performs writing by a spin transfer torque magnetization reversal system. That is, a relative angle of magnetization between a storage layer and a fixed layer is changed to the parallel state and the anti-parallel state (that is, the minimum and maximum resistances) depending on a direction of a current flowing in the film plane perpendicular direction in each layer and binary information "0" or "1" is corresponded thereto, thereby storing information.

As shown in FIG. 1, the magnetoresistive element 1 has at least two magnetic layers 2, 3, and a nonmagnetic layer 4 provided between the magnetic layer 2 and the magnetic layer 3. The magnetic layer 3 has a magnetization easy axis (an axis of easy magnetization) perpendicular to a film plane, and the magnetization direction rotates. The magnetic layer 3 will be called storage layer (free layer, free magnetization layer, variable magnetization layer, and recording layer) below. Detailed properties of the storage layer (magnetic layer) 3 will be described later. The magnetization of the film plane perpendicular direction will be called perpendicular magnetization below.

The magnetic layer 2 has a magnetization easy axis perpendicular to a film plane and the magnetization direction is fixed. The magnetic layer 2 will be called fixed layer (fixed magnetization layer, reference layer, reference magnetization layer, pinned layer, reference layer, and reference magnetization layer) below. Detailed properties of the fixed layer (magnetic layer) 2 will be described later. The magnetization direction of the fixed layer 2 faces opposite to a substrate (upward) as a typical example, but may face the substrate (downward).

The nonmagnetic layer (tunnel barrier layer) 4 is made of an insulating film such as oxide. More detailed properties of the nonmagnetic layer 4 will be described later.

The magnetoresistive element 1 is a magnetoresistive element used for the spin transfer torque write system. That is, during the writing, a current is flowed in the film plane perpendicular direction from the fixed layer 2 to the storage layer 3 or from the storage layer 3 to the fixed layer 2 so that electrons accumulating spin information therein are injected from the fixed layer 2 to the storage layer 3.

A spin momentum of the electrons to be injected is transferred to the electrons in the storage layer 3 according to the law of conservation of spin momentum so that the magnetization of the storage layer 3 is switched. That is, the magnetization direction of the storage layer 3 changes depending on a bidirectional current through the storage layer 3, the nonmagnetic layer 4 and the fixed layer 2.

FIG. 1 shows a so-called bottom-free structure (top-pinned structure) in which the storage layer 3 is formed on an underlying layer 5 and the fixed layer 2 is formed on the nonmagnetic layer 4.

The underlying layer 5 is used for controlling adhesion between the substrate and a layer formed on the underlying layer 5, or crystalline properties such as crystalline orientation and crystal grain size, and its detailed properties will be described later.

A cap layer 6 may be further formed on the fixed layer 2. The cap layer 6 mainly functions as a protective layer for preventing oxidization of the magnetic layers, and the like.

The storage layer 3 is configured such that a magnetic material and a nonmagnetic material are repeatedly laminated at least twice. In other words, the storage layer 3 is configured such that a magnetic material and a nonmagnetic material are alternately laminated. In other words, the storage layer 3 is configured such that a magnetic material 31, a nonmagnetic material 32, a magnetic material 33 and a nonmagnetic material 34 are laminated in this order between the nonmagnetic layer 4 and the underlying layer 5 from the nonmagnetic layer 4 side.

The nonmagnetic materials 32, 34 include at least one element from among Ta, W, Nb, Mo, Zr and Hf. Further, one of the magnetic materials contacts the nonmagnetic layer 4. That is, the magnetic material 31 contacts the nonmagnetic layer 4. The nonmagnetic material 34 contacts the underlying layer 5. The nonmagnetic material 34 may immediately contact an interconnect layer.

The magnetic materials 31, 33 are ferromagnetic layers and include Co and Fe. For example, the magnetic material 31 is made of a CoFe alloy, or an alloy containing Co, Fe and B $(Co_{100-x}-Fe_x)_{100-y}B_y$, where x≥50 at % and 0<y≤30 at %. The magnetic material 33 is made of a CoFe alloy, or an alloy containing Co, Fe and B $(Co_{100-x}-Fe_x)_{100-y}B_y$, where x≥0 at % and 0<y≤30 at %.

The magnetic material 33 and the nonmagnetic material 32, non-contacting the nonmagnetic layer 4, contain an amorphous state. The magnetic material 31 contacting the nonmagnetic layer 4 and the magnetic material 33 non-contacting the nonmagnetic layer 4 have different crystalline states.

For example, the thickness of the magnetic material 31 is 0.5 to 1.5 nm, the thickness of the nonmagnetic material 32 is 0.5 to 2 nm, the thickness of the magnetic material 33 is 0.5 to 5 nm, and the thickness of the nonmagnetic material 34 is 1 to 10 nm.

A magnetoresistive element according to the variants of the first embodiment will be described below.

FIG. 2 is a cross-sectional view of the first variant of the magnetoresistive element shown in FIG. 1.

The structure shown in FIG. 2 is different from the structure in FIG. 1 in that the nonmagnetic material 34 configuring the storage layer 3 contacts an interconnect layer 10. Other structures are the same as those of FIG. 1.

FIG. 3 is a cross-sectional view of the second variant of the magnetoresistive element shown in FIG. 1.

The structure shown in FIG. 3 is different from the structure in FIG. 1 in that an interface layer 11 is inserted between the fixed layer 2 and the nonmagnetic layer 4. The interface layer 11 is formed of a ferromagnetic material and has an effect of relaxing a lattice mismatch at the interface between the fixed layer 2 and the nonmagnetic layer 4. Further, a material with high polarization is used for the interface layer 11 thereby to realize a high tunnel magnetoresistance (TMR) ratio and a high spin transfer torque efficiency. Detailed properties of the interface layer 11 will be described later.

Figure 4:
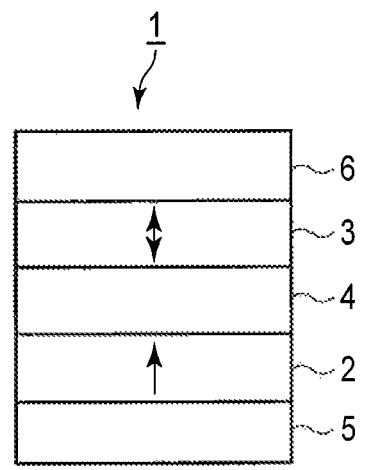
FIG. 4 is a cross-sectional view of a magnetoresistive element according to a third variant of the first embodiment.

FIG. 4 is a cross-sectional view of the third variant of the magnetoresistive element shown in FIG. 1.

The magnetoresistive element shown in FIG. 4 has a so-called top-free (bottom-pinned) structure in which the fixed layer 2 is formed on the underlying layer 5 and the storage layer 3 is formed on the nonmagnetic layer 4. The magnetoresistive element according to the present embodiment may have the bottom-pinned structure in which the fixed layer 2 and the storage layer 3 are exchanged as shown in FIG. 4.

FIG. 5 is a cross-sectional view of the fourth variant of the magnetoresistive element shown in FIG. 1.

The structure shown in FIG. 5 is different from the structure in FIG. 1 in that a nonmagnetic layer 21 and a shift cancelling layer (shift adjustment layer) 22 are inserted between the fixed layer 2 and the cap layer 6.

The shift cancelling layer 22 is made of a ferromagnetic material and is a perpendicular magnetization film having a magnetization easy axis in the film plane perpendicular direction, and its magnetization direction is fixed opposite to the magnetization direction of the fixed layer 2. The shift cancelling layer 22 has an effect of adjusting an offset of switching field of the storage layer due to a strayed field from the fixed layer 2. That is, the shift cancelling layer 22 has an effect of relaxing and adjusting a shift of the switching current of the storage layer 3 due to the strayed field from the fixed layer 2. Detailed properties of the nonmagnetic layer 21 and the shift cancelling layer 22 will be described later.

In the structure of FIG. 1, a nonmagnetic layer and a shift cancelling layer (shift adjustment layer) may be inserted between the storage layer 3 and the underlying layer 5. For the top-free structure (the bottom-pinned structure) shown in FIG. 4, a shift cancelling layer (shift adjustment layer) and a nonmagnetic layer may be provided between the underlying layer 5 and the fixed layer 2. Also in the structure of FIG. 5, an interface layer may be inserted between the nonmagnetic layer 4 and the fixed layer 2 as in FIG. 3.

The underlying layer 5 contacting the storage layer 3, the interconnect layer 10, the cap layer 6, and an electrode layer 7 described later, which are described according to the first embodiment, all function as a conductive layer for flowing a current through the storage layer 3.

(2) Method for Manufacturing Magnetoresistive Element

A method for manufacturing the magnetoresistive element 1 shown in FIG. 1 will be described.

At first, the underlying layer 5 is formed by the sputtering method on a semiconductor substrate on which transistors and interconnects are formed. Then, the storage layer 3 is formed on the underlying layer 5 by the sputtering method. That is, the nonmagnetic material 34 is formed on the underlying layer 5 by the sputtering method. The magnetic material 33 is formed on the nonmagnetic material 34 by the sputtering method. The nonmagnetic material 32 is formed on the magnetic material 33 by the sputtering method. The magnetic material 31 is formed on the nonmagnetic material 32 by the sputtering method.

Then, the nonmagnetic layer 4 is formed on the magnetic material 31 by the sputtering method. The fixed layer 2 is formed on the nonmagnetic layer 4 by the sputtering method. Further, the cap layer 6 is formed on the fixed layer 2 by the sputtering method.

Thereafter, a thermal processing is performed on the underlying layer 5, the storage layer 3, the nonmagnetic layer 4, the fixed layer 2 and the cap layer 6. Then, the underlying layer 5, the storage layer 3, the nonmagnetic layer 4, the fixed layer 2 and the cap layer 6 are patterned by the lithography method thereby to form the magnetoresistive element 1 shown in FIG. 1.

After the thermal processing, the magnetic material 33 and the nonmagnetic material 32, not contacting the nonmagnetic layer 4, include an amorphous state. Since the nonmagnetic material 32 includes an amorphous state, the crystallization of the magnetic material 31 is difficult to occur from the nonmagnetic material 32 side and is easy to occur from the nonmagnetic layer 4 side. Thus, there can be obtained a magnetoresistive element having a less lattice mismatch at the interface between the magnetic material 31 and the nonmagnetic layer 4, a low resistance, and a high magnetoresistance ratio (MR ratio).

(3) Storage Layer

When the perpendicular magnetization film is used for the storage layer 3 in the magnetoresistive element 1, shape magnetic anisotropy is not utilized as described above, thereby further reducing the element size than in the in-plane magnetization structure. Further, a material indicating large perpendicular magnetic anisotropy is used for the storage layer 3 so that both small size and low switching current can be realized while a thermal stability is kept.

The properties to be provided in the storage layer, and specific examples of material selection will be described below in detail.

(3-1) Properties to be Provided in Storage Layer

When the perpendicular magnetization material is used for the storage layer, its thermal stability factor $\Delta$ is expressed as in (Equation 1) with a ratio between an effective anisotropic energy $K_u^{\mathit{eff}} \cdot V$ and a thermal energy $k_B T$:

$$\Delta = K_u^{\mathit{eff}} \cdot V / k_B T \qquad \text{(Equation 1)}$$
$$= (K_u - 2\pi N M_s^2) \cdot Va / k_B T$$

where,
$K_u$: Perpendicular magnetic anisotropy energy
$M_S$: Saturation magnetization
N: Demagnetization factor, and
$V_a$: Magnetization reversal unit volume In order to avoid a problem (thermal disturbance) that the magnetization fluctuates due to a thermal energy, a necessary condition is that the thermal stability factor is larger than ($\Delta > \sim 60$), but when the element size is smaller or the thickness is thinner in consideration of larger capacity, Va is smaller, and the storage cannot be kept (=thermal disturbance) and is unstable.

Thus, it is desirable to select a material having a larger perpendicular magnetic anisotropy energy $K_u$ and/or smaller saturation magnetization $M_S$ for the storage layer.

On the other hand, a critical current $I_C$ necessary for switching the magnetization due to spin transfer torque writing in the perpendicular magnetization system is typically expressed as in Equation 2

$$Ic \propto \alpha / \eta \cdot \Delta \qquad \text{(Equation 2)}$$

where
$\alpha$: Magnetic relaxation constant, and
$\eta$: Spin transfer torque efficiency factor (3-2) Storage Layer Material As described above, it is desirable that the storage layer 3 is a perpendicular magnetization film, and the magnetic relaxation constant $\alpha$ is smaller and the spin transfer torque efficiency factor $\eta$ is larger while the thermal stability factor $\Delta$ is kept in order to realize both sufficient thermal stability and magnetization switching at a low switching current. The spin transfer torque efficiency factor η monotonically increases relative to the polarization and thus a material indicating a high polarization is desirable.

An example will be specifically described below.

In the bottom-free structure, the storage layer 3 needs to be formed on the substrate on which transistors or interconnects are integrated. At this time, it is assumed that various materials are formed for the integration on the substrate surface prior to forming the storage layer 3, and thus the property of the storage layer should not be changed depending on the surface state such as structure or roughness. When a change occurs, the change causes a variation in property in the storage layer, which is not preferable.

The study results on a combination of magnetic material and nonmagnetic material and perpendicular magnetic anisotropy will be denoted below in simulation of the bottom-free structure.

The structure is such that nonmagnetic material (Zr or Nb, Mo, Hf, Ta, W)/magnetic material (FeCoB)/MgO (3 nm) are sequentially formed on the Si substrate. Each nonmagnetic material has a different degree of mixing with the magnetic material, and thus anisotropy fields (Hk) are compared when a magnetic moment per unit area is about $1 \times 10^{-4}$ emu/cm$^2$. The anisotropy field is calculated by applying a magnetic field in the in-film direction, and measuring and evaluating a hysteresis loop of a hard axis by a vibrating sample magnetometer. Consequently, it is seen that the anisotropy field of 2 kOe or more is indicated in any nonmagnetic materials of Zr, Nb, Mo, Hf, Ta and W and the perpendicular magnetic anisotropy is indicated. The anisotropy field of 5 kOe or more is obtained for Nb, Mo, Ta and W.

Figure 6A:
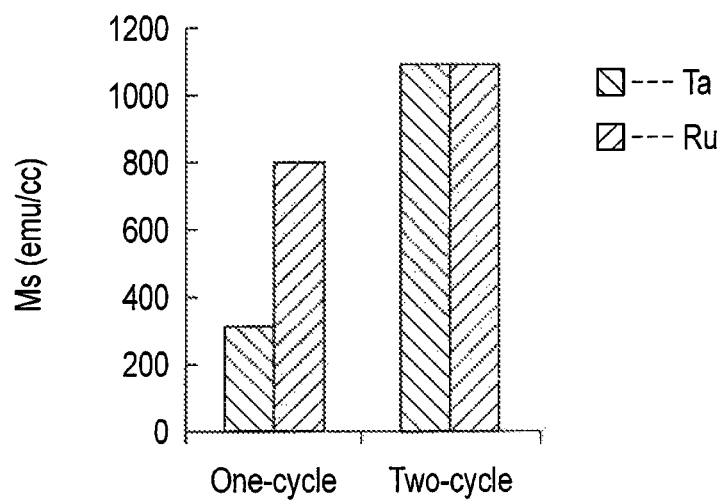
FIG. 6A is a diagram showing saturation magnetization of a storage layer when a material of a substrate surface is changed according to the first embodiment.
Figure 6B:
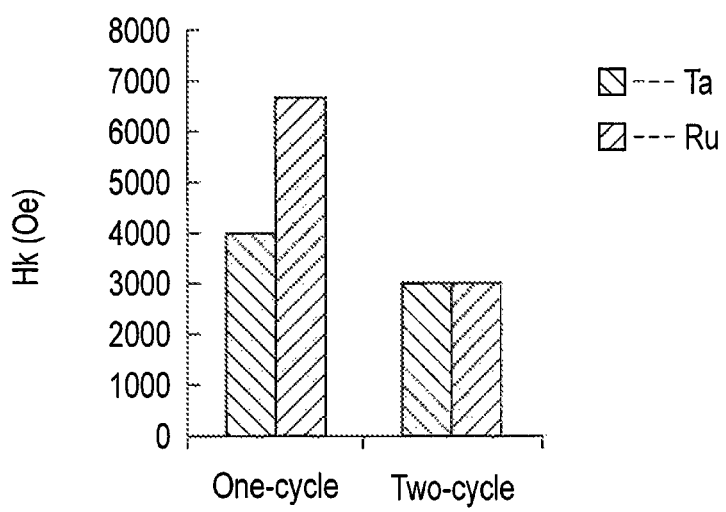
FIG. 6B is a diagram showing anisotropy field of the storage layer when a material of the substrate surface is changed according to the first embodiment.

FIGS. 6A and 6B show the changes in the saturation magnetization Ms and the anisotropy field Hk in the storage layer when the material of the substrate surface is changed before the storage layer is formed.

W (0.3 nm)/CoFeB (0.8 nm)/W (0.3 nm)/CoFeB (1 nm)/MgO (1.5 nm)/Ta (5 nm) are sequentially formed from the substrate side in the structure of the storage layer 3. The numbers in parentheses indicate the thicknesses. Ta with 5 nm is formed on MgO in order to restrict a change in the nature of MgO. The sample is subjected to the thermal processing at 400° C.

As a comparative example, W (0.3 nm)/CoFeB (1 nm)/MgO (15 nm)/Ta (5 nm) are formed such that a repetition of the magnetic material (CoFeB) and the nonmagnetic material (W) corresponds to one cycle. Ta or Ru is used as a material of the substrate surface before W (0.3 mm) as the lowermost layer of the storage layer 3 is formed. The surface of Ta is metallic, and amorphous or microcrystalline, and the surface of Ru is metallic and is where an atomically closed packed surface is oriented.

For the substrate in which the material (Ta or Ru) of the substrate surface is changed before the formation of the storage layer, the saturation magnetization Ms and the anisotropy field Hk change in the comparative example with one-cycle repetition while they do not change in two-cycle repetition. For the saturation magnetization Ms and the anisotropy field Hk, the hysteresis loops of the magnetization easy axis and the magnetization hard axis are measured and evaluated by the vibrating sample magnetometer.

When the thickness of the nonmagnetic material W is 0.3 nm, the magnetic moment of the repeatedly laminated magnetic materials CoFeB does not disappear and has a certain value. For example, when the thickness of W is increased from 0.3 to 1 nm, the magnetic moment of CoFeB at MgO side does not disappear and has a certain value, but the magnetic moment of CoFeB between W disappears due to its upper and lower W. In this case, CoFeB contacting MgO functions as a magnetic layer and W/CoFeB/W function as an underlying layer. CoFeB contacting MgO is crystallized from MgO side.

FIG. 7 shows an exemplary magnetic property when W sandwiched between CoFeB is thicker. When the thickness of W is increased from 0.3, 0.5, and to 1 nm, the magnetic moment per unit area decreases, and when the thickness of W is 1 nm, the magnetic moment is the same as the magnetic moment in one-cycle repetition (dotted line). That is, it is assumed that when the thickness of W is about 1 nm, the magnetic moment of CoFeB sandwiched between W disappears. As described above, the thicknesses of the magnetic material and the nonmagnetic material can be adjusted as needed in consideration of magnetic properties and electric properties.

It can be seen that the magnetic relaxation constant further decreases and the MR ratio further increases in two-cycle repetition than in one-cycle repetition.

In the top-free structure, the storage layer 3 is formed on the nonmagnetic layer 4. FIG. 8 shows the magnetic properties of the one-cycle structure and the two-cycle structure of the magnetic material and the nonmagnetic material.

In both the example and the comparative example, MgO (2 nm) is formed as a layer corresponding to the nonmagnetic layer 4. In the example, CoFeB (1.2 nm)/W (0.3 nm)/CoFeB are sequentially formed on MgO and W (3 nm)/Ta (2 nm) are formed as a cap layer. The thickness of the second-cycle CoFeB is considered at 0.8 to 3 nm. The sample is thermally processed at 400° C.

In the comparative example, CoFeB/W (0.3 nm) are sequentially formed on MgO and W (3 nm)/Ta (2 nm) are formed as a cap layer such that a repetition of the magnetic material (CoFeB) and the nonmagnetic material (W) corresponds to one cycle. The magnetic property is measured by the vibrating sample magnetometer.

Thereby, the anisotropy field Hk can be further increased in the two-cycle structure than in the one-cycle structure. Further, it is seen that the film thickness is larger in the two-cycle structure and thus the thermal stability factor A can be increased.

As described above, a magnetic material containing Co and Fe is selected as the magnetic layer, a nonmagnetic material containing at least one element of Zr, Nb, Mo, Hf, Ta and W is selected as the nonmagnetic layer, and a repetition cycle of the magnetic material and the nonmagnetic material is assumed at 2 cycles or more so that the storage layer 3 suitable for the spin transfer torque magnetization reversal can be formed.

(4) Underlying Layer

In the so-called bottom-free structure in which the storage layer 3 is formed on the underlying layer 5, the underlying layer may not be particularly provided. That is, the storage layer 3 may be directly formed on the integrated substrate surface. An underlying material may be selected in terms of adhesion.

In the so-called bottom-pinned structure in which the fixed layer 2 or the shift adjustment layer is formed on the underlying layer 5, the underlying material may be selected depending on a material system in consideration of crystalline orientation or the like.

In the bottom-pinned structure in which the fixed layer 2 is formed on the underlying layer 5, the underlying layer 5 may be selected depending on a material system as follows. When an multilayer system such as Co/Pt, Co/Pd or Co/Ni, a CoPd alloy of fcc or hcp, a CoPt alloy, or a RE-TM ordered alloy (such as Sm—Co) is used for the underlying layer 5, a metal having an atomically closed packed structure is desirable. The metal having an atomically closed packed structure may include Pt, Pd, Ir, Ru and the like.

For example, the metal may not be one element, and may be an alloy in which the metal is made of two elements, three elements or more like Pt—Pd and Pt—Ir. There may be employed an alloy of the above metal and the fcc metal such as Cu, Au or Al including Pt—Cu, Pd—Cu, Ir—Cu, Pt—Au, Ru—Au, Pt—Al or Ir—Al, or an alloy of the above metal and the hcp metal such as Re, Ti, Zr or Hf including Pt—Re, Pt—Ti, Ru—Re, Ru—Ti, Ru—Zr or Ru—Hf.

Since if the underlying layer 5 is too thick, its smoothness is deteriorated, the film thickness range is preferably 30 nm or less. The underlying layer 5 may be laminated. The laminated structure is employed because the materials having different lattice constants are laminated thereby to adjust the lattice constants. For example, when there is employed the laminated structure in which Pt is formed on Ru in the underlying layer 5, Pt is influenced by Ru and consequently has a different lattice constant from the bulk lattice constant. As described above, the lattice constant can be adjusted even by the alloy and thus either Ru or Pt can be omitted.

When the underlying layer has the laminated structure, Ta or Ti is used for the lowermost layer so that the smoothness can be enhanced and the crystalline orientation of the metal having an atomically closed packed structure can be enhanced. The thickness of Ta or Ti of the lowermost layer causes a reduction in productivity since it takes much time for a film with too much thickness to be formed. On the other hand, since the effect of the orientation control is lost due to a film with too small thickness, the thickness is preferably in the range of 1 and 10 nm.

In the case of $L1_0$ ordered alloy such as FePt or FePd, the fcc metal such as Pt or Pd in which the (100) plane is oriented, the bcc metal such as Cr, or a compound having a NaCl structure such as Tin or MgO desirable.

The RE-TM amorphous alloy is amorphous and thus the underlying layer may be of a material system serving as an adhesion layer such as Ta.

(5) Nonmagnetic Layer

Oxide having the NaCl structure is preferable for the material of the nonmagnetic layer 4 in the magnetoresistive element 1. Specifically, MgCi, CaO, SrO, TiO, VO, NbO and the like may be employed. When the magnetization direction of the storage layer 3 is anti-parallel to the magnetization direction of the fixed layer 2, a spin polarized $\Delta 1$ band is responsible for the tunnel conduction and thus only majority spin electrons contribute to the conduction. Consequently, the conductivity of the magnetoresistive element 1 decreases and the resistance increases.

Conversely, when the magnetization direction of the storage layer 3 is parallel to the magnetization direction of the fixed layer 3, a spin non-polarized $\Delta 5$ band governs the conduction and thus the conductivity of the magnetoresistive element 1 increases and the resistance decreases. Thus, the formation of the $\Delta 1$ band is a key for expressing the high tunnel magnetoresistance (TMR) ratio.

In order to form the $\Delta 1$ band, the match of the interface between the (100) plane of the nonmagnetic layer 4 made of oxide in the NaCl structure and the storage layer 3 as well as the fixed layer 2 should be preferable.

In order to further improve the lattice match at the (100) plane of the nonmagnetic layer 4 made of the oxide layer in the NaCl structure, the interface layer 11 may be inserted. In terms of the formation of the $\Delta 1$ band, a material in which the lattice mismatch is 5% or less at the (100) plane of the nonmagnetic layer 4 is more preferably selected for the interface layer 11.

(6) Fixed Layer

A material in which the magnetization direction does not easily change for the storage layer 3 is preferably selected for the fixed layer 2 in the magnetoresistive element 1 shown in FIGS. 1 to 5. That is, it is preferable to select a material having larger effective magnetic anisotropy energy $K_u^{\it eff}$, larger saturation magnetization Ms and a higher magnetic relaxation constant $\alpha$. Specific materials will be described later.

(6-1) Ordered Alloy

The ordered alloy system contains one or more elements from among Fe, Co and Ni and one or more elements from among Pt and Pd, and has an alloy crystalline structure of $L1_0$. For example, there may be employed $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$, $Co_{30}Ni_{20}Pt_{50}$ and the like. The composition ratios of the ordered alloys are not limited thereto.

The ordered alloys are added with an inpurity element such as copper (Cu), chrome (Cr) or silver (Ag) or their alloy, or an insulator thereby to adjust the effective magnetic anisotropic energy and the saturation magnetization. When the alloys are used for the fixed layer 2, particularly when a material having a large mismatch with the nonmagnetic layer 4 is selected, the interface layer 11 is preferably inserted between the nonmagnetic layer 4 and the fixed layer 2 as shown in FIG. 3.

(6-2) Multilayer System.

The multilayer system is configured such that an alloy containing one or more elements from among Fe, Co and Ni and an alloy containing one or more elements from among Cr, Pt, Pd, Ir, Rh, Ru, Os, Re, Au and Cu are alternately laminated. For example, there may be employed a Co/Pt multilayer, a Co/Pd multilayer, a CoCr/Pt multilayer, a Co/Ru multilayer, Co/Os, Co/Au, a Ni/Cu multilayer, and the like.

The multilayers can adjust the effective magnetic anisotropic energy and the saturation magnetization by adding an element to the magnetic layer and adjusting the thickness ratio between the magnetic layer and the nonmagnetic layer and the laminate cycle. When the laminated films are used for the fixed layer 2, the lattice mismatch with the nonmagnetic layer 4 is larger in many cases, which is not preferable for obtaining a high tunnel magnetoresistance (TMR) ratio.

In this case, the interface layer 11 is preferably inserted between the nonmagnetic layer 4 and the fixed layer 2 as shown in FIG. 3.

(6-3) Disordered Alloy System.

A disordered alloy system is a metal containing a main component of cobalt (Co) and containing one or more elements from among chrome (Cr), tantalum (Ta), niobium (Nb), vanadium (V), tungsten (W), hafnium (Hf), titanium (Ti), zirconium (Zr), platinum (Pt), palladium (Pd), iron (Fe) and nickel (Ni).

For example, there may be employed a CoCr alloy, a CoPt alloy, a CoCrPt alloy, a CoCrPtTa alloy, a CoCrNb alloy and the like.

The alloys can increase the rate of the nonmagnetic elements and adjust the effective magnetic anisotropic energy and the saturation magnetization. When the alloys are employed for the fixed layer 2, a lattice mismatch with the nonmagnetic layer 4 is larger in many cases, which is not preferable for obtaining a high tunnel magnetoresistance (TMR) ratio.

In this case, the interface layer 11 is preferably inserted between the nonmagnetic layer 4 and the fixed layer 2 as shown in FIG. 3.

(7) Interface Layer

The interface layer 11 may be arranged at the interface of the fixed layer (magnetic layer) 2 contacting the nonmagnetic layer 4 in the magnetoresistive element 1 in order to enhance the tunnel magnetoresistance (TMR) ratio as shown in FIG. 3.

Preferably, the interface layer 11 is made of a high polarization material, specifically an alloy containing Co, Fe and B $(Co_{100-x}—Fe_x)_{100-y}B_y$, where x≥20 at % and 0<y≤30 at %.

The magnetic materials are used for the interface layer 11 so that the lattice mismatch between the fixed layer 2 and the nonmagnetic layer 4 is relaxed and the realization of the high tunnel magnetoresistance (TMR) ratio and the high spin transfer torque efficiency is expected due to the high polarization materials.

(8) Shift Cancelling Layer

As shown in FIG. 5, the nonmagnetic layer 21 and the shift cancelling layer (shift adjustment layer) 22 may be arranged between the fixed layer 2 and the cap layer 6 in the magnetoresistive element 1. Thereby, a shift in the switching current of the storage layer 3 due to a strayed field from the fixed layer 2 can be relaxed and adjusted.

The nonmagnetic layer 21 preferably has a function of controlling a heat tolerance by which the fixed layer 2 and the shift cancelling layer 22 are not mixed in the heating step, and a crystalline orientation when forming the shift cancelling layer 22.

Since the distance between the shift cancelling layer 22 and the storage layer 3 is longer as the thickness of the nonmagnetic layer 21 is thicker, magnetic field to be applied from the shift cancelling layer 22 to the storage layer 3 is made smaller. Thus, the thickness of the nonmagnetic layer 21 is preferably 5 nm or less.

The shift cancelling layer 22 is made of a ferromagnetic material having a magnetization easy axis in the film plane perpendicular direction. Specifically, only the materials possible for the fixed layer 2 may be used. Since the shift cancelling layer 22 is further separated from the storage layer 3 than from the fixed layer 2, the thickness of the shift cancelling layer 22 or the magnitude of the saturation magnetization Ms needs to be set larger than that of the fixed layer 2 in order to adjust the strayed field to be applied to the storage layer 3 by the shift cancelling layer 22.

That is, assuming that the thickness and the saturation magnetization of the fixed layer 2 are $t_2$ and $M_{S2}$, respectively, and the thickness and the saturation magnetization of the shift cancelling layer 22 are $t_{22}$ and $M_{S22}$, respectively, the following relational equation (Equation 3) needs to be met:

$$M_{S2} \times t_2 < M_{S22} \times t_{22} \quad \text{(Equation 3)}$$

For example, assuming the machining of the element size of 50 nm, when a magnetic material having the saturation magnetization Ms of 1000 emu/cc and the thickness of 5 nm is used for the fixed layer 2, there is required, for cancelling the shift in the switching current, the shift cancelling layer properties that the nonmagnetic layer 21 has the thickness of 3 nm and the shift cancelling layer 22 has the saturation magnetization Ms of 1000 emu/cc and the thickness of about 15 nm.

Further, in order to obtain the above shift cancelling effect, the magnetization directions of the fixed layer 2 and the shift cancelling layer 22 need to be set to be anti-parallel.

In order to meet the relationship, a material meeting the relationship of Hc2>Hc22 or Hc2<Hc22 may be selected for a coercive force Hc2 of the fixed layer 2 and a coercive force Hc22 of the shift cancelling layer 22. In this case, the magnetization direction of the layer having a smaller coercive force is previously inverted so that the magnetization directions of the fixed layer 2 and the shift cancelling layer 22 can be set to be anti-parallel.

Also when the fixed layer 2 and the shift cancelling layer 22 are subjected to synthetic anti-ferromagnet (SAF) combination via the nonmagnetic layer 21, the magnetization directions of the fixed layer 2 and the shift cancelling layer 22 can be similarly set to be anti-parallel.

Specifically, ruthenium (Ru) is used for the material of the nonmagnetic layer 21, for example, so that the magnetization directions of the fixed layer 2 and the shift cancelling layer 22 can be combined to be anti-parallel. Thereby, the strayed field from the fixed layer 2 can be reduced by the shift cancelling layer 22 and consequently the shift in the switching current of the storage layer 3 can be reduced. As a result, a variation in the switching current of the storage layer 3 can be reduced between the elements.

As described above, with the magnetoresistive element according to the first embodiment, there can be obtained the magnetoresistive element in the spin transfer torque write system capable of switching the magnetization of the storage layer at a low switching current.

Second Embodiment

A magnetic random access memory (MRAM) according to a second embodiment will be described with reference to FIGS. 9 and 10. The MRAM according to the second embodiment is configured by use of the magnetoresistive element according to the first embodiment as a storage device.

FIG. 9 is a circuit diagram showing a structure of the MRAM according to the second embodiment.

As illustrated, the MRAM comprises a memory cell array 40 having a plurality of memory cells MC arranged in a matrix shape. A plurality of bit line pairs BL and /BL are arranged in the memory cell array 40 to extend in the column direction. A plurality of word lines WL are arranged in the memory cell array 40 to extend in the row direction.

The memory cell MC is arranged on the cross point between the bit line BL and the word line WL. Each memory cell MC comprises a magnetoresistive element 1 and a select transistor (such as an n-channel MOS transistor) 41. The magnetoresistive element 1 is connected at one end to the bit line BL. The magnetoresistive element 1 is connected at the other end to the drain terminal of the select transistor 41. The source terminal of the select transistor 41 is connected to the bit line /BL. Further the gate terminal of the select transistor 41 is connected to the word line WL.

A row decoder 42 is connected to the word lines WL. A write circuit 44 and a read circuit 45 are connected to the bit line pairs BL and /BL. A column decoder 43 is connected to the write circuit 44 and the read circuit 45. Each memory cell MC is selected by the row decoder 42 and the column decoder 43.

Data is written into the memory cell MC as follows. At first, the word line WL connected to the memory cell MC is activated for selecting the memory cell MC into which data is to be written. Thereby, the select transistor 41 is turned on.

The magnetoresistive element 1 is supplied with a bidirectional write current Iw in response to the written data. Specifically, when the write current Iw is supplied in the magnetoresistive element 1 from left to right, the write circuit 44 applies a positive voltage to the bit line BL and applies a ground voltage to the bit line /BL. When the write current Iw is supplied in the magnetoresistive element 1 from right to left, the write circuit 44 applies a positive voltage to the bit line /BL and applies a ground voltage to the bit line BL. In this way, binary 0 or binary 1 can be written to the memory cell MC.

Then, data is read from the memory cell MC as follows. At first, the select transistor 41 of the memory cell MC to be selected is turned on. The read circuit 45 supplies a read current Ir in the magnetoresistive element 1 from right to left, for example, that is, supplies the read current Ir from the bit line /BL to the bit line BL. The read circuit 45 detects the resistance of the magnetoresistive element 1 based on the read current Ir. Further, the read circuit 45 reads the data stored in the magnetoresistive element 1 based on the detected resistance.

The structure of the MRAM according to the embodiment will be described below with reference to FIG. 10, FIG. 10 is a cross-sectional view showing the structure of a memory cell MC.

As illustrated, the memory cell MC has the magnetoresistive element (MTJ) 1 and the select transistor 41. A surface region of a p-type semiconductor substrate 51 is provided with an element isolation insulating layer 46. A surface region of the semiconductor substrate 51 in which the element isolation insulating layer 46 is not provided is an active area in which the devices are to be formed. The element isolation insulating layer 46 is configured by shallow trench isolation (STI), for example, The STI uses silicon oxide, for example.

A source region S and a drain region. D, separated from each other, are formed in the active area in the semiconductor substrate 51. The source region S and the drain region D are formed of an n+ type diffusion region formed by introducing a high-concentration impurity such as an n+ type impurity into the semiconductor substrate 51, respectively.

A gate insulating film 41A is formed on the semiconductor substrate 51 between the source region S and the drain region D. A gate electrode 41B is formed on the gate insulating film 41A, The gate electrode 41B functions as a word line WL. The semiconductor substrate 51 is provided with the select transistor 41.

An interconnect layer 53 is formed on the source region S via a contact 52. The interconnect layer 53 functions as a bit line /BL. A lead line 55 is formed on the drain region D via a contact 54.

The magnetoresistive element. 1 sandwiched between a lower electrode 7 and an upper electrode 9 is provided on the lead line 55. An interconnect layer 56 is formed on the upper electrode 9. The interconnect layer 56 functions as a bit line BL. An interlayer insulating layer 57 made of silicon oxide, for example, is filled between the semiconductor substrate 51 and the interconnect layer 56.

As detailed above, according to the second embodiment, the MRAM can be configured by use of the magnetoresistive element 1. The magnetoresistive element 1 may be used as a domain wall motion type magnetic memory in addition to the spin transfer torque write type magnetic memory.

The MRAM according to the second embodiment can be applied to various devices. Several exemplary applications of the MRAM will be described below.

(1) Exemplary Application 1

FIG. 11 specifically shows a DSL data path unit for a digital subscriber line (DSL) modem.

The modem comprises a programmable digital signal processor (DSP) 100, an analog-to-digital converter (ADC) 110, a digital-to-analog converter (DAC) 120, a transmission driver 130, a receiver amplifier 140 and the like.

In FIG. 11, a bandpass filter is omitted, and instead the MRAM 170 according to the second embodiment and an electrically erasable and programmable ROM (EEPROM) 180 are shown as optional memories of various types for holding a line code program (a program which is executed by the DSP and is directed for selecting and operating a modem depending on subscriber line information to be coded and transmission conditions (such as line code [QAM, CAP, RSK, FM, AM, PAM and DWMT]).

In the present exemplary application, the two types of memories including the MRAM 170 and the EEPROM 180 are used as the memories for holding the line code program, but the EEPROM 180 may be replaced with the MRAM. That is, only the MRAM may be used, not using the two types of memories.

(2) Exemplary Application 2

FIG. 12 shows a cell phone terminal 300 as another exemplary application.

A communication unit 200 for realizing a communication function comprises a transmission/reception antenna 201, an antenna duplexer 202, a receiver 203, a baseband processor 204, a digital signal processor (DSP) 205 used as an audio codec, a speaker (receiver) 206, a microphone (transmitter) 207, a transmitter 208, a frequency synthesizer 209 and the like.

The cell phone terminal 300 is provided with a control unit 220 for controlling the respective units in the cell phone terminal 300. The control unit 220 is a microcomputer formed by connecting a CPU 221, a ROM 222, the MRAM 223 according to the second embodiment, and a flash memory 224 via a bus 225.

The ROM 222 previously stores therein necessary data such as programs to be executed by the CPU 221 or display font.

The MRAM 223 is mainly used as a working area, and is used for storing data being calculated during the execution of a program by the CPU 21 as needed or for temporarily storing data to be exchanged between the control unit 220 and each unit.

The flash memory 224 is directed for storing the last setting conditions even when the power supply of the cell phone terminal 300 is turned off, and for storing the setting parameters when the same setting is used for the next power-on. Thereby, even when the power supply of the cell phone terminal 300 is turned off, the stored setting parameters will not be lost.

The cell phone terminal 300 is provided with an audio data reproduction processor 211, an external output terminal 212, a liquid crystal display (LCD) controller 213, a display LCD 214, a ringer 215 for generating a phone ring, and the like.

The audio data reproduction processor 211 reproduces audio data input into the cell phone terminal 300 (or audio information (audio data) stored in an external memory 240 described later), The audio data (audio information) to be reproduced is sent to a headphone or portable speaker via the external output terminal 212 thereby to be externally extracted.

In this way, the audio data reproduction processor 211 is provided thereby to reproduce the audio information. The LCD controller 213 receives, for example, the display information from the CPU 221 via the bus 225, converts it to LCD control information for controlling the LCD 214, and drives the LCD 214 to display the LCD control information.

Further, the cell phone terminal 300 is provided with interface circuits (I/F) 231, 233, 235, the external memory 240, an external memory slot 232, a key operation unit 234, an external I/O terminal 236, and the like. The external memory slot 232 is inserted with the external memory 240 such as memory card. The external memory slot 232 is connected to the bus 225 via the interface circuit (I/F) 231.

In this way, the cell phone terminal 300 is provided with the slot 232 thereby to write the information inside the cell phone terminal 300 into the external memory 240 or to input the information (such as audio information) stored in the external memory 240 into the cell phone terminal 300.

The key operation unit 234 is connected to the bus 225 via the interface circuit (I/F) 233. Key input information input from the key operation unit 234 is sent to the CPU 221, for example. The external I/O terminal 236 is connected to the bus 225 via the interface circuit (I/F) 235. The external I/O terminal 236 functions as a terminal for inputting various items of information into the cell phone terminal 300 from the outside or outputting the information from the cell phone terminal 300 to the outside.

The ROM 222, the MRAM 223 and the flash memory 224 are used in the present exemplary application, but the flash memory 2224 may be replaced with the MRAM and the ROM 222 may be replaced with the MRAM.

(3) Exemplary Application 3

FIGS. 13 to 17 show the examples in which the MRAM is applied to a card (MRAM card) for housing media contents such as smart media, respectively.

As shown in FIG. 13, an MRAM card main body 400 incorporates an MRAM chip 401 therein. The card main body 400 is formed with an opening 402 in correspondence to the MRAM chip 401 and the MRAM chip 401 is exposed. The opening 402 is provided with a shutter 403 and the MRAM chip 401 is protected by the shutter 403 while the MRAM card is being carried. The shutter 403 is made of a material having an effect of shielding an external magnetic field, such as ceramic.

When data is to be transferred, the shutter 403 is opened to expose the MRAM chip 401. An external terminal 404 is directed for taking the content data stored in the MRAM card to the outside.

Figure 14:
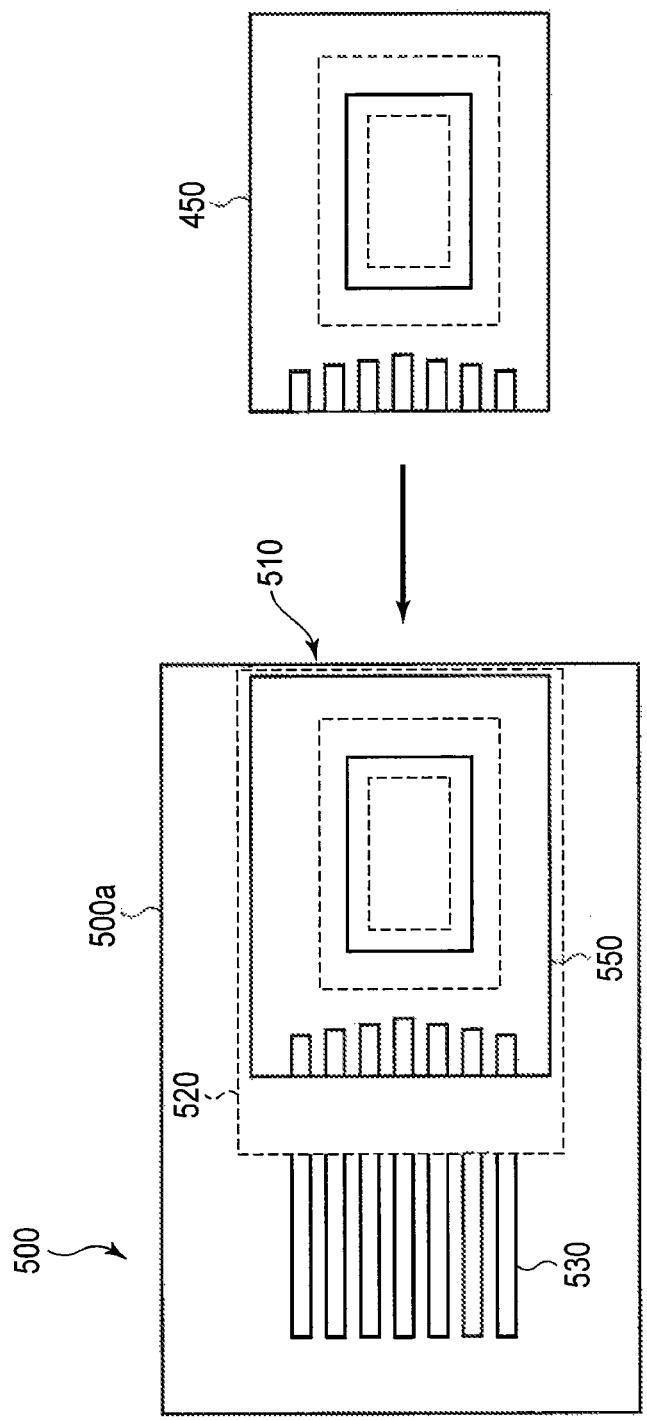
FIG. 14 is a plan view showing a card insertion type transfer apparatus as an application example.
Figure 15:
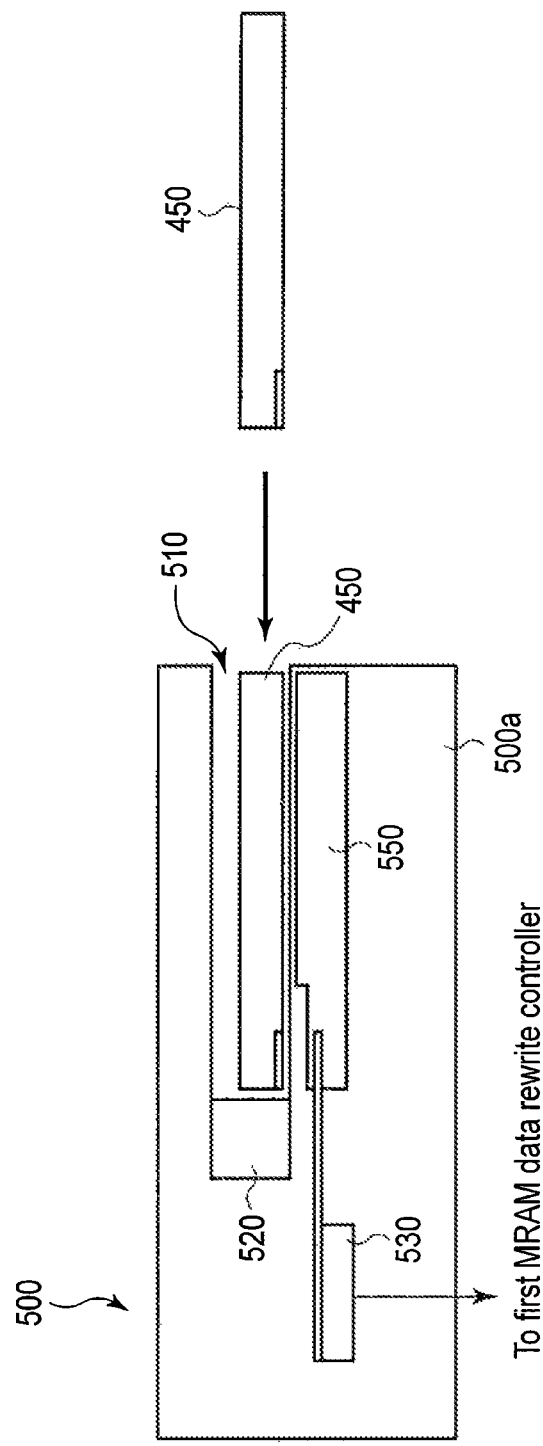
FIG. 15 is a sectional view showing the card insertion type transfer apparatus as an application example.

FIGS. 14 and 15 show a card insertion type transfer device for transferring data into the MRAM card.

A data transfer device 500 has a housing unit 500a. The housing unit 500a houses a first MRAM card 550 therein. The housing unit 500a is provided with an external terminal 530 electrically connected to the first MRAM card 550, and the external terminal 530 is used to rewrite the data in the first MRAM card 550.

A second MRAM card 450 used by an end user is inserted into an insertion unit 510 in the transfer device 500 as indicated by the arrow, and is pushed up to a stopper 520. The stopper 520 also functions as a member for positioning the first MRAM card 550 and the second MRAM card 450. When the second MRAM card 450 is arranged at a predetermined position, a control signal is supplied from a first MRAM data rewrite controller unit to the external terminal 530 so that the data stored in the first MRAM card 550 is transferred into the second MRAM card 450.

Figure 16:
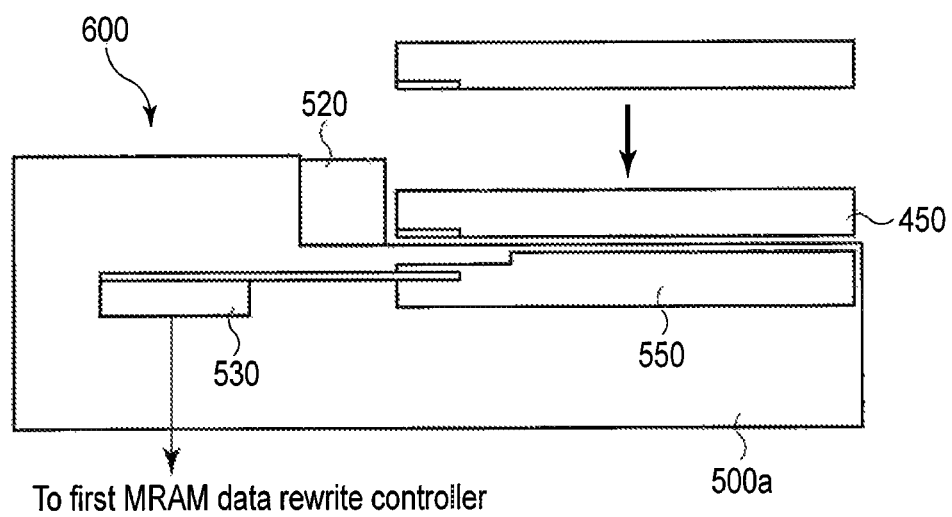
FIG. 16 is a sectional view showing a fitting type transfer apparatus as an application example.

FIG. 16 is a cross-sectional view showing a fit-in type transfer device for transferring data into an MRAM card.

A transfer device 600 is of a type in which the second MRAM card 450 is fitted onto the first MRAM card 550 up to the stopper 520 as indicated by the arrow. The transfer method is the same as that of the card insertion type and an explanation thereof will be omitted.

Figure 17:
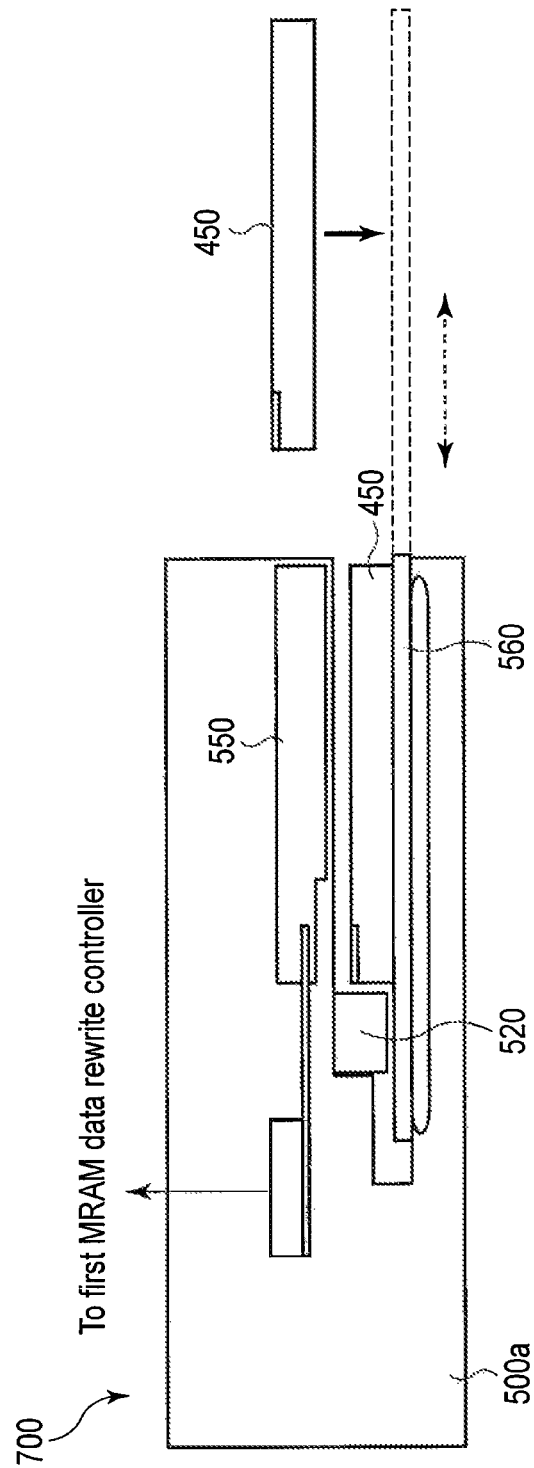
FIG. 17 is a sectional view showing a sliding type transfer apparatus as an application example.

FIG. 17 is a cross-sectional view showing a slide type transfer device for transferring data into an MRAM card.

A transfer device 700 is provided with a receiving slide 560 similarly to a CD-ROM drive or DVD drive, and the receiving slide 560 moves as indicated by the arrow. When the receiving slide 560 moves to a position in the broken line, the second MRAM card 450 is placed on the receiving slide 560 and then the receiving slide 560 moves to carry the second MRAM card 450 inside the transfer device 700.

The tip end of the second MRAM card 450 contacts the stopper 520 and the transfer method is performed similarly as the card insertion type transfer device, and thus an explanation thereof will be omitted.

The MRAM according to the second embodiment can be used for a high-speed randomly-writable file memory, a high-speed downloadable portable terminal, a high-speed downloadable portable player, a semiconductor memory for broadcast device, a drive recorder, a home video, a large capacity buffer memory for communication, a semiconductor memory for security camera, and the like, and thus many industrial merits can be obtained.

As described above, according to the embodiments, it is possible to provide a magnetoresistive element in a spin transfer torque write system, a magnetic memory using the magnetoresistive element, and a method for manufacturing a magnetoresistive element capable of switching the magnetization of a storage layer at a low switching current.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
a first magnetic layer having an axis of easy magnetization perpendicular to a film plane, and a variable magnetization direction;
a second magnetic layer having an axis of easy magnetization perpendicular to a film plane, and an invariable magnetization direction;
a first nonmagnetic layer provided between the first magnetic layer and the second magnetic layer; and
a conductive layer formed on a surface of the first magnetic layer, which is opposite to a surface on which the first nonmagnetic layer is formed,
wherein the first magnetic layer comprises:
a first magnetic material including Co and Fe;
a first nonmagnetic material including at least one element from among Ta, W, Nb, Mo, Zr and Hf;
a second nonmagnetic material including at least one element from among Ta, W, Nb, Mo, Zr and Hf; and
a second magnetic material including Co and Fe,
wherein the first magnetic material contacts the first nonmagnetic layer and includes a crystallized portion, the first nonmagnetic material contacts the conductive layer, the second nonmagnetic material is between the first magnetic material and the first nonmagnetic material and includes an amorphous state, and the second magnetic material is between the second nonmagnetic material and the first nonmagnetic material and includes an amorphous state.

2. The magnetoresistive element according to claim 1, wherein the first magnetic material is made of a CoFe alloy or an alloy $(Co_{100-x}-Fe_x)_{100-y}B_y$ containing Co, Fe and B where x≥50 at % and 0<y≤30 at %.

3. The magnetoresistive element according to claim 1, wherein the first magnetic material and the second magnetic material have different crystalline states.

4. The magnetoresistive element according to claim 1, wherein the first magnetic layer has a structure in which a magnetic material, a nonmagnetic material, a magnetic material and a nonmagnetic material are laminated in this order between the first nonmagnetic layer and the conductive layer from the first nonmagnetic layer side.

5. The magnetoresistive element according to claim 1, further comprising:
an interface layer which is arranged between the second magnetic layer and the first nonmagnetic layer and has a high polarization.

6. The magnetoresistive element according to claim 1, further comprising:
a shift cancelling layer formed on a surface of the second magnetic layer, which is opposite to a surface on which the first nonmagnetic layer is formed, and which has a magnetization direction reverse to the magnetization direction of the second magnetic layer; and
a second nonmagnetic layer arranged between the second magnetic layer and the shift cancelling layer.

7. The magnetoresistive element according to claim 6, wherein the second nonmagnetic layer includes Ru.

8. The magnetoresistive element according to claim 1, further comprising:
a shift cancelling layer which is arranged between the first magnetic layer and the conductive layer and has a magnetization direction reverse to the magnetization direction of the second magnetic layer; and
a second nonmagnetic layer arranged between the first magnetic layer and the shift cancelling layer.

9. The magnetoresistive element according to claim 8, wherein the second nonmagnetic layer includes Ru.

10. The magnetoresistive element according to claim 1, further comprising
a cap layer formed on a surface of the second magnetic layer, which is opposite to a surface on which the first nonmagnetic layer is formed.

11. The magnetoresistive element according to claim 1, wherein the first nonmagnetic layer includes a tunnel barrier layer.

12. The magnetoresistive element according to claim 11, wherein the first nonmagnetic layer includes any one of MgO, CaO, SrO, TiO, VO and NbO.

13. The magnetoresistive element according to claim 1, wherein the conductive layer includes an interconnect layer.

14. The magnetoresistive element according to claim 1, wherein the conductive layer includes Ta or Ru.

15. A magnetic memory comprising a memory cell including the magnetoresistive element according to claim 1, and first and second electrodes for sandwiching the magnetoresistive element and for electrically conducting the magnetoresistive element.

16. The magnetic memory according to claim 15, further comprising:
a first interconnect electrically connected to the first electrode;
a second interconnect electrically connected to the second electrode; and
a write circuit which is electrically connected to the first interconnect and the second interconnect and supplies a bidirectional current to the magnetoresistive element.

17. A method of manufacturing a magnetoresistive element comprising:
forming a first nonmagnetic material;
forming a first magnetic material on the first nonmagnetic material;
forming a second nonmagnetic material on the first magnetic material;
forming a second magnetic material on the second nonmagnetic material;
forming a nonmagnetic layer on the second magnetic material;
forming a magnetic layer on the nonmagnetic layer; and
performing a thermal processing after forming the magnetic layer,
wherein after the thermal processing, the second magnetic material includes a crystallized portion, the second nonmagnetic material includes an amorphous state, and the first magnetic material includes an amorphous state.

18. The method of manufacturing a magnetoresistive element according to claim 17,
wherein the second magnetic material is less likely to be crystallized from the second nonmagnetic material side and is likely to be crystallized from the nonmagnetic layer side.

* * * * *